(12) United States Patent
Ives et al.

(10) Patent No.: US 6,996,051 B2
(45) Date of Patent: Feb. 7, 2006

(54) DATA STORAGE MODULE SUSPENSION SYSTEM HAVING PRIMARY AND SECONDARY FLEXURES

(75) Inventors: Thomas Wayne Ives, Boise, ID (US); Donald J. Fasen, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 158 days.

(21) Appl. No.: 10/134,195

(22) Filed: Apr. 29, 2002

(65) Prior Publication Data

US 2003/0202288 A1    Oct. 30, 2003

(51) Int. Cl.
*G11B 9/00*    (2006.01)

(52) U.S. Cl. ...................................... 369/126

(58) Field of Classification Search ............ 360/245.6, 360/294.1, 294.3; 369/126

See application file for complete search history.

(56) References Cited

U.S. PATENT DOCUMENTS

| | | | |
|---|---|---|---|
| 5,233,213 A * | 8/1993 | Marek ...................... | 361/283.2 |
| 5,557,596 A | 9/1996 | Gibson et al. | |
| 5,834,864 A * | 11/1998 | Hesterman et al. ...... | 360/78.12 |
| 6,194,892 B1 * | 2/2001 | Lin et al. .................. | 360/266.1 |
| 6,198,145 B1 * | 3/2001 | Ferrari et al. ............... | 361/207 |
| 6,282,066 B1 * | 8/2001 | Bonin ...................... | 360/294.1 |
| 6,411,589 B1 * | 6/2002 | Hoen et al. ................. | 369/126 |
| 6,509,620 B2 * | 1/2003 | Hartwell et al. ............ | 257/415 |
| 6,587,312 B2 * | 7/2003 | Murari et al. ............. | 360/294.3 |
| 6,624,981 B1 * | 9/2003 | Vigna ...................... | 360/245.6 |
| 6,735,163 B2 * | 5/2004 | Marshall .................... | 369/126 |
| 2003/0185139 A1 * | 10/2003 | Ives ........................... | 369/126 |
| 2003/0185140 A1 * | 10/2003 | Ives ........................... | 369/101 |
| 2003/0197446 A1 * | 10/2003 | Ives ........................... | 310/309 |

* cited by examiner

*Primary Examiner*—Craig A. Renner

(57) ABSTRACT

A micro-electro-mechanical device includes a moveable mass supported within a frame. To support the mass within the frame, a first flexure extends between the mass and the frame. An angle softening element is positioned between a first end of the first flexure and the frame to allow angular movement of the first flexure.

13 Claims, 7 Drawing Sheets

DATA STORAGE MODULE SUSPENSION SYSTEM HAVING PRIMARY AND SECONDARY FLEXURES

THE FIELD OF THE INVENTION

The present invention generally relates to data storage devices, and more particularly to a suspension system for a storage module used in high density data storage devices.

BACKGROUND OF THE INVENTION

It is well recognized in the field of data storage that it is desirable to increase the storage density and reduce the cost of storage in information storage devices. This is generally true for all types of information storage devices, such as magnetic hard drives, optical drives, RAM devices, and other information storage devices. However, it becomes increasingly difficult to squeeze more information into the storage devices. Moreover, conventional technologies to make those storage devices may be approaching fundamental limits on storage density.

There are many proposed alternatives to increase the storage density of storage devices. Some examples are Scanned Probe Microscopy (SPM), Atomic Force Microscopy, Scanning Tunneling Microscopy (STM), Near-Field Scanning Optical Microscopy, and Scanning Force Microscopy. Each of these proposed alternatives has its own benefits and detriments. Some are extremely expensive to build; some are difficult to implement; others have limited or poor resolution and bandwidth; still others have poor signal-to-noise ratios.

Even if one is successful in increasing the storage density, another major hurdle must still be overcome. Specifically, the time required to access the stored information must be small. Simply put, a storage device's utility is limited if it takes too long to retrieve the stored information, no matter what it's storage density. In other words, in addition to high storage density, one must find a way to quickly access the information.

In U.S. Pat. No. 5,557,596 to Gibson et al., an ultra-high density storage device which provides increased storage density while having fast access times and high data rates is described and claimed. The ultra-density storage device of Gibson et al. is based on the use of electron emitters, which are made by standard semiconductor fabrication technology, and which emit beams of electrons from very sharp points. In one embodiment of Gibson et al., the storage device includes many electron emitters, a storage medium and a micro mover. The storage medium has many storage areas, and the electron emitters are spaced apart to have one emitter responsible for a number of storage areas on the storage medium. In one embodiment, each storage area is responsible for one bit of data on the storage device. The medium is in close proximity to the electron emitters, such as a few hundredths of a micrometer to a few micrometers away.

Each field emitter generates an electron beam current. Each storage area can be in one of a few different states. In one embodiment, binary information is stored in the areas, with one state representing a high bit and another state representing a low bit. When an electron beam current bombards a storage area, a signal current is generated. The magnitude of the signal currents depends on the state of that storage area. Thus, information stored in the area can be read by measuring the magnitude of the signal current. Information can be written onto the storage areas using the electron beams. The magnitude of each electron beam can be increased to a pre-selected level to change the states of the storage area on which it impinges. By changing the state of a storage area, information is written onto it.

Like the electron emitters, the micro mover is made by semiconductor micro fabrication techniques. The micro mover scans the storage medium with respect to the electron emitters or vice versa. Thus, each emitter can access information from a number of storage areas on the storage medium. With hundreds or thousands of electron emitters reading and/or writing information in parallel, the storage device has very fast access times and data rates.

To assure that the storage medium is accurately written to and read as it is moved by the micro movers, it is desirable for the storage medium to have complete ease of motion in the plane of the storage medium, and to have no motion in the direction normal to the plane of the storage medium. In this manner, the distance between the electron emitters and the storage medium is kept constant.

Although it is desired that the storage medium move only in a single plane, achieving this result is difficult. For example, the micro mover is intended to move the storage medium solely in the plane of the storage medium (i.e., in the X-Y plane). However, depending upon the type of micro mover, there may be a tendency for the micro mover to move the storage medium out-of-plane (i.e., displace the storage medium in the Z direction). Also, environmental factors such as vibration may cause or contribute to out-of-plane movement.

Out-of-plane movement may be restricted by decreasing the out-of-plane compliance. Compliance refers to the ease with which the storage medium moves, with higher compliance meaning less resistance to movement. However, restricting the out-of-plane movement of the storage medium by decreasing the out-of-plane compliance often results in decreased in-plane compliance. This decreased in-plane compliance may be sufficient to adversely affect the operation of the memory device because the forces generated by the micro mover are typically not very strong. It thus becomes a balance to suspend the storage medium in a manner which makes the ratio of in-plane to out-of-plane compliance (the "compliance ratio") as high as possible. A suspension system design which increases the in-plane compliance while maintaining, or improving, the compliance ratio is desirable.

SUMMARY OF THE INVENTION

A micro-electro-mechanical device provides an improved in-plane compliance and compliance ratio. The device includes a moveable mass supported within a frame. To support the mass within the frame, a first flexure extends between the mass and the frame. An angle softening element is positioned between a first end of the first flexure and the frame to allow angular movement of the first flexure.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
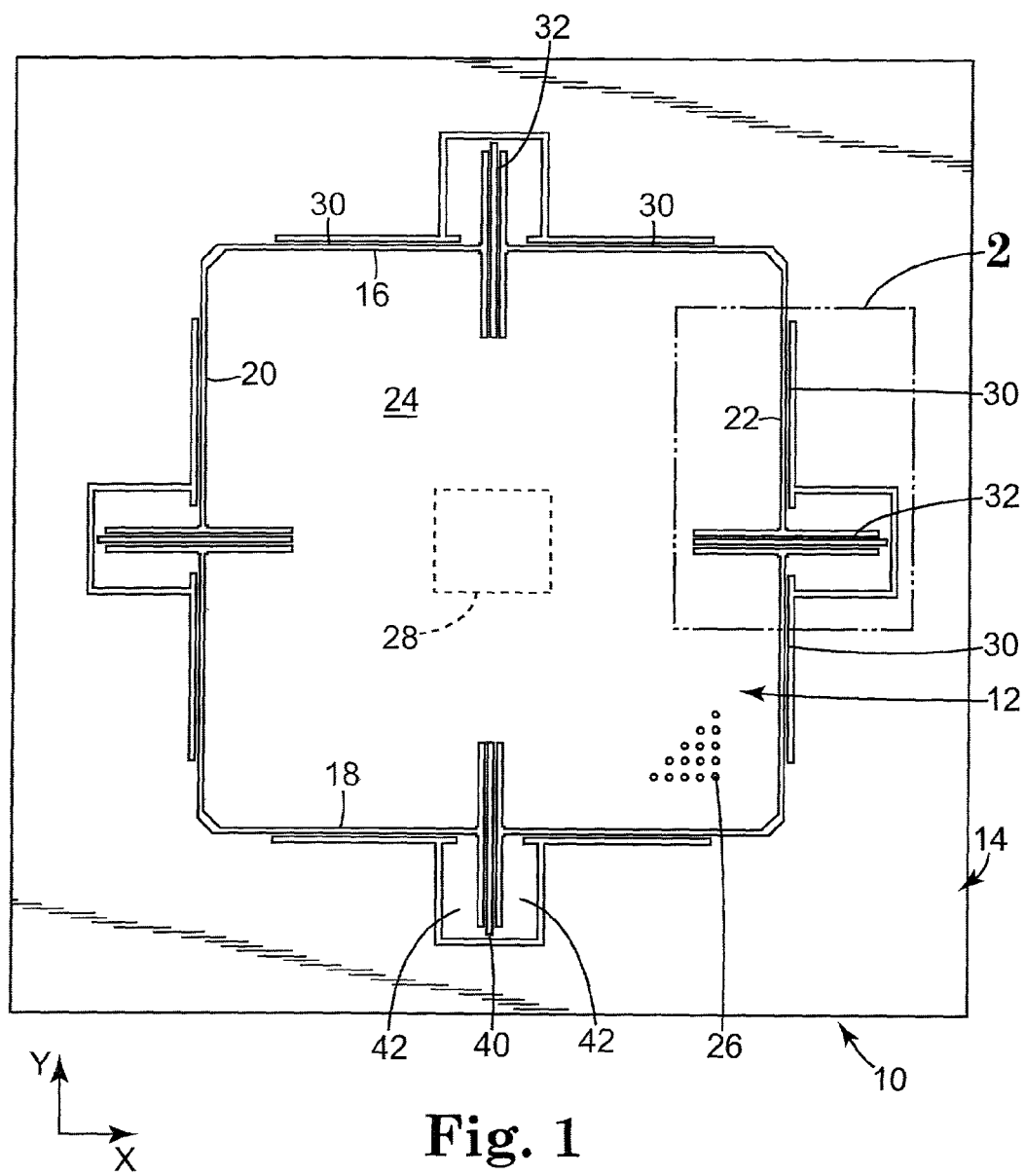
FIG. 1 is a top view of a single rotor suspended within a frame.
Figure 2:
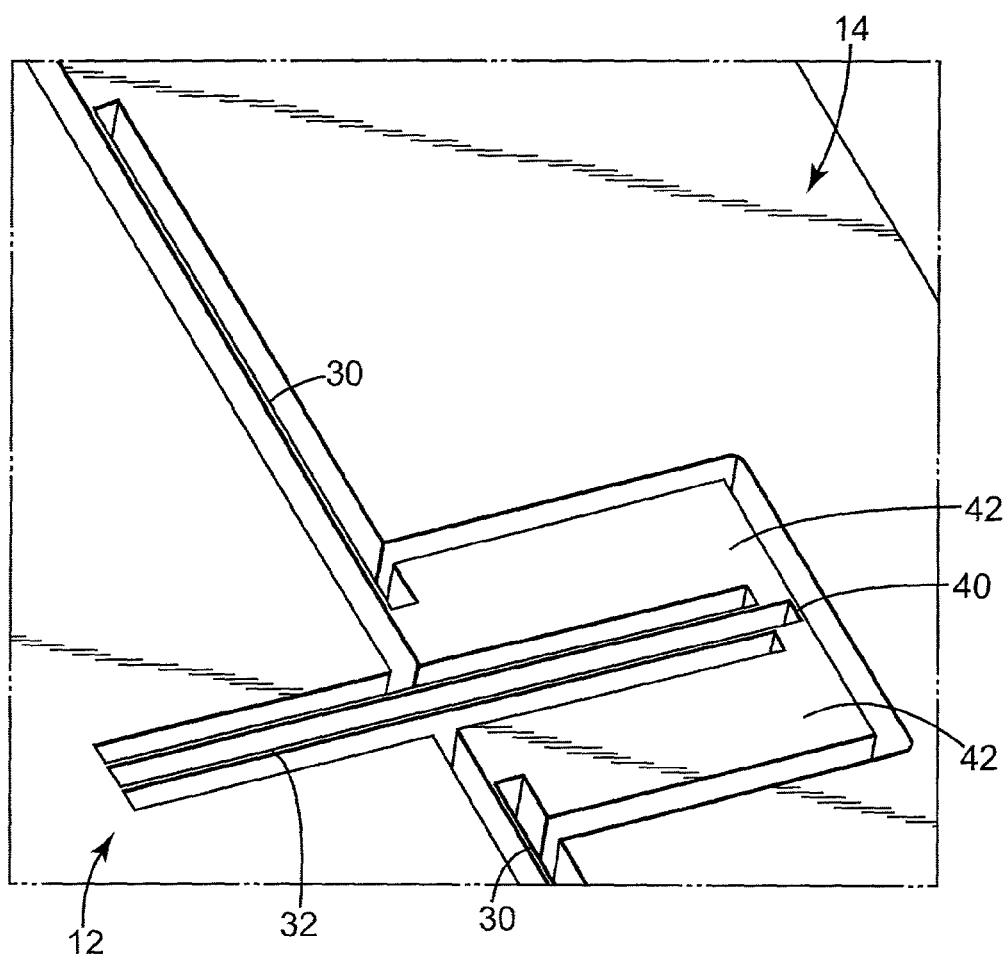
FIG. 2 is a greatly enlarged perspective view of the area 2 of FIG. 1.

One embodiment of a high-density storage module 10 is illustrated in FIGS. 1 and 2. Storage module 10 includes a rotor 12 and a frame 14 for supporting rotor 12. Rotor 12 is bounded by its top edge 16, bottom edge 18, left edge 20 and right edge 22. The front face 24 of rotor 12 defines an X-Y plane, with top edge 16 and bottom edge 18 aligned with the X-axis, and left edge 20 and right edge 22 aligned with the Y-axis. Front face 24 of rotor 12 is formed from a storage medium that has a plurality of storage areas 26 for data storage. The storage areas 26 (shown generically) are in one of a plurality of states to represent data stored in that area. Rotor frame 14 is spaced from rotor edges 16, 18, 20 and 22. In one embodiment of the invention, rotor frame 14 surrounds rotor 12 in the X-Y plane. Rotor 12 is moved by a micro-mover or actuator 28, which may be, for example, located on a back face of rotor 12, opposite front face 24. A micro-mover 28 is generically illustrated in FIG. 1. (As used herein, directional terms such as top, bottom, left, right, front and back are relative terms, and should not be construed as a limitation on the overall orientation of the storage module 10).

Rotor 12 is supported within rotor frame 14 by a suspension system comprised of external flexures 30 and internal flexures 32 which interconnect rotor 12 and rotor frame 14. Flexures 30, 32 are also referred to herein as beams. Many MEMS devices use thin-walled micro fabricated beams or flexures to support moveable masses within their systems. The flexures supply both support for the moveable mass and compliance for the mass movements.

As discussed above, it is often desirable to have a suspension system which provides high compliance in the X-Y plane (in-plane compliance) and low compliance in directions out of the X-Y plane (out-of-plane compliance). A high compliance ratio tends to maintain rotor 12 within the X-Y plane and facilitates better operation of the memory device.

Increasing the in-plane compliance may be accomplished in more than one way. For example, in-plane compliance may be increased by allowing for axial shortening of the beams or flexures. That is, as the beams flex they tend to become shorter in the axial direction, which in turn leads to a decrease in the in-plane compliance. Compensating for this axial shortening has the effect of increasing the in-plane compliance. In the suspension system shown in FIGS. 1 and 2, the short coupling beam 40 between coupling blocks 42 has the effect of compensating for axial shortening of external flexures 30.

The in-plane compliance of the suspension system may also be increased by allowing the ends of flexures 30, 32 to move angularly. Even a small angular movement in the range of 0.5 to 1.0 degrees at either or both ends of flexures 30, 32 can increase the in-plane compliance of the device significantly, without a proportional increase in the out-of-plane compliance. That is, the in-plane compliance increases, while the compliance ratio is maintained or increases. Although coupling beam 40 in FIG. 1 provides a small degree of angular deflection for external flexures 30, providing a larger angular deflection would provide even greater compliance.

Figure 3:
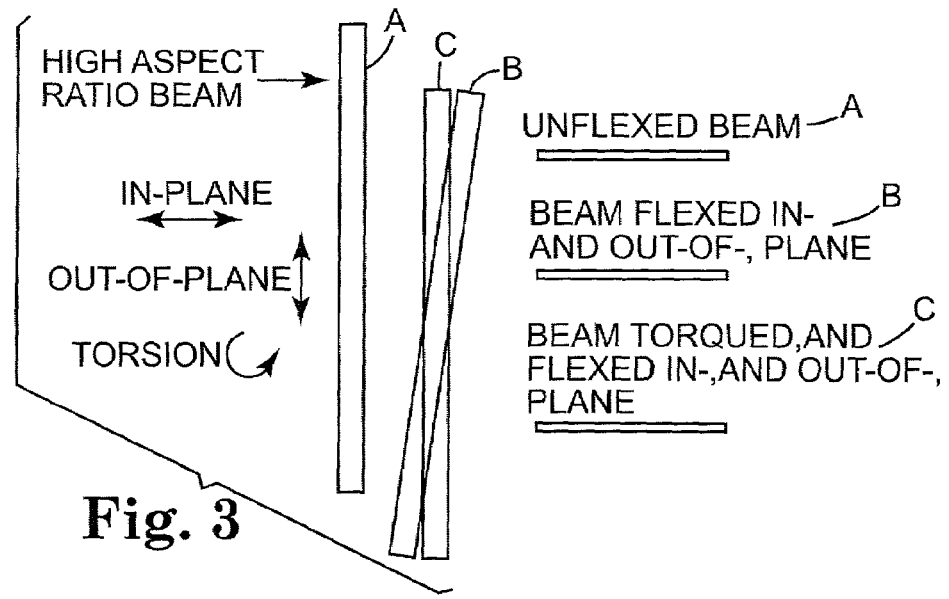
FIG. 3 is an illustration of beam movement and torsion according to one embodiment of the invention.

Although long, high aspect flexures like those shown in FIG. 1 tend to have high in-plane compliance, they also have reduced in-plane to out-of-plane compliance ratios due to beam torsion. As referred to herein, high aspect ratio beams are intended to include those beams having height to width ratios of approximately 10 or greater. This phenomenon is described with reference to FIG. 3, in which a cross-sectional representation of a high aspect flexure is shown under no load (Position A), under in-plane and out-of-plane loads (Position B), and under in-plane, out-of-plane and torsion loads (Position C). As a long, high aspect beam is flexed in-plane and out-of-plane, a torsion occurs in the beam. The torsion occurs even though the beam does not twist with respect to its axial plane. Because the motion of rotor 12 puts the beam in torsion due to the moment arms arising from displacement of rotor 12, the beam's tendency is to flex back from the Position C (illustrated in FIG. 3) toward the Position B.

As noted above, it is often desirable to have the greatest in-plane to out-of-plane compliance ratio possible. However, the compliance ratio is often decreased by the torsions present in the beam as described above. To maintain a higher compliance ratio, it is desirable to decrease the beam's torsional and out-of-plane compliance while maximizing its in-plane compliance.

As with in-plane compliance, out-of-plane and torsional compliance may be affected in more than one way. For example, the torsional and out-of-plane compliance of flexures 30, 32 may be decreased by shortening the length of the flexures. The torsional and out-of-plane compliance may also be reduced by careful selection of the suspension system geometry. In the device illustrated in FIG. 1, the torsional and out-of-plane compliance of flexures 30, 32 are reduced by aligning the flexures 30, 32 in such a way as to effectively counteract the torsions created as the rotor 12 is displaced along the Z-axis (that is, when rotor 12 is pulled up or down by the micro mover 28). The greatest counter-action effect is achieved when external flexures 30 are oriented to axially point at the midpoint of internal flexures 32 as shown in FIG. 1. However, counteraction of the torsions are also achieved the lesser extent when the intersection is not at the midpoint of internal flexures 32. Thus, the position of the external flexures 30 is such that the axis of external flexures 30 intersects the internal flexures 32 somewhere along the length of flexures 32.

As can be seen, the balancing of in-plane, out-of-plane and torsional compliances, both in absolute and relative terms, requires a balancing of factors to reach a suitable result for a particular application. In embodiments of the invention described herein, a suspension system is described which allows the compliance ratio of the supporting flexures to be increased, while reducing or minimizing the influence of torsional compliance.

Figure 4:
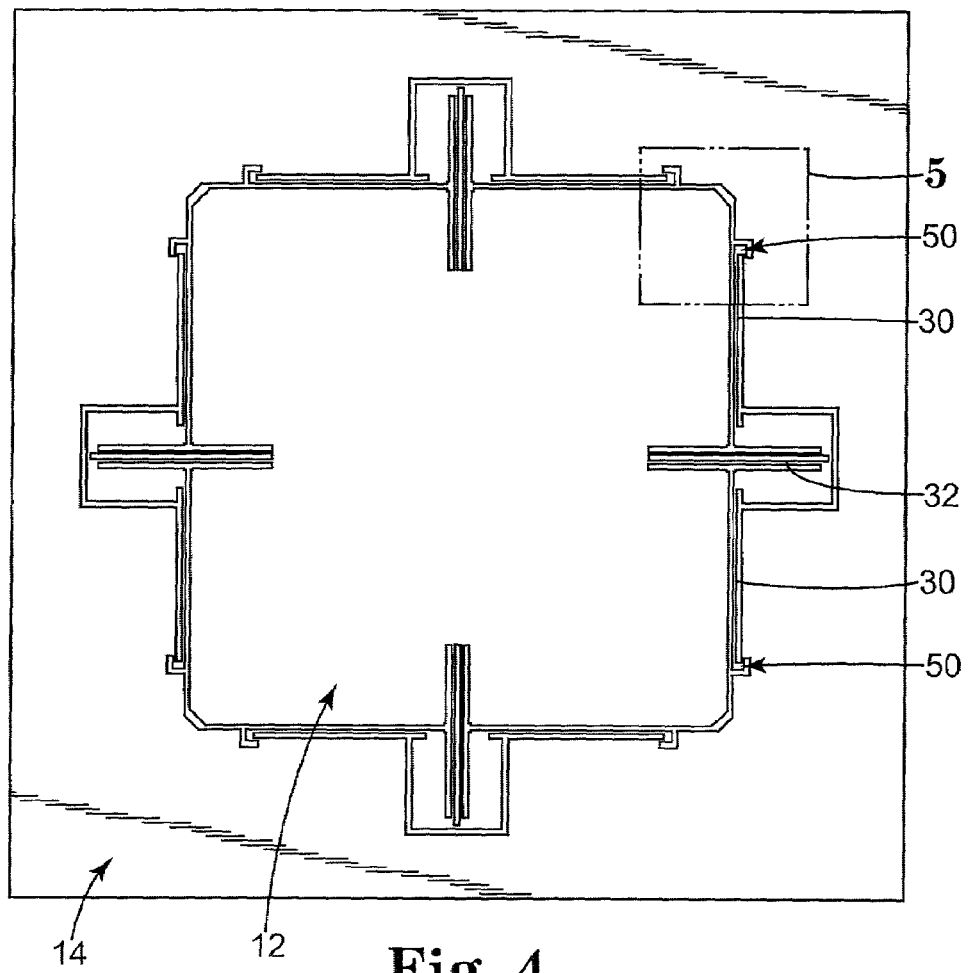
FIG. 4 is a top view of angle softening elements according to one embodiment of the invention.
Figure 5:
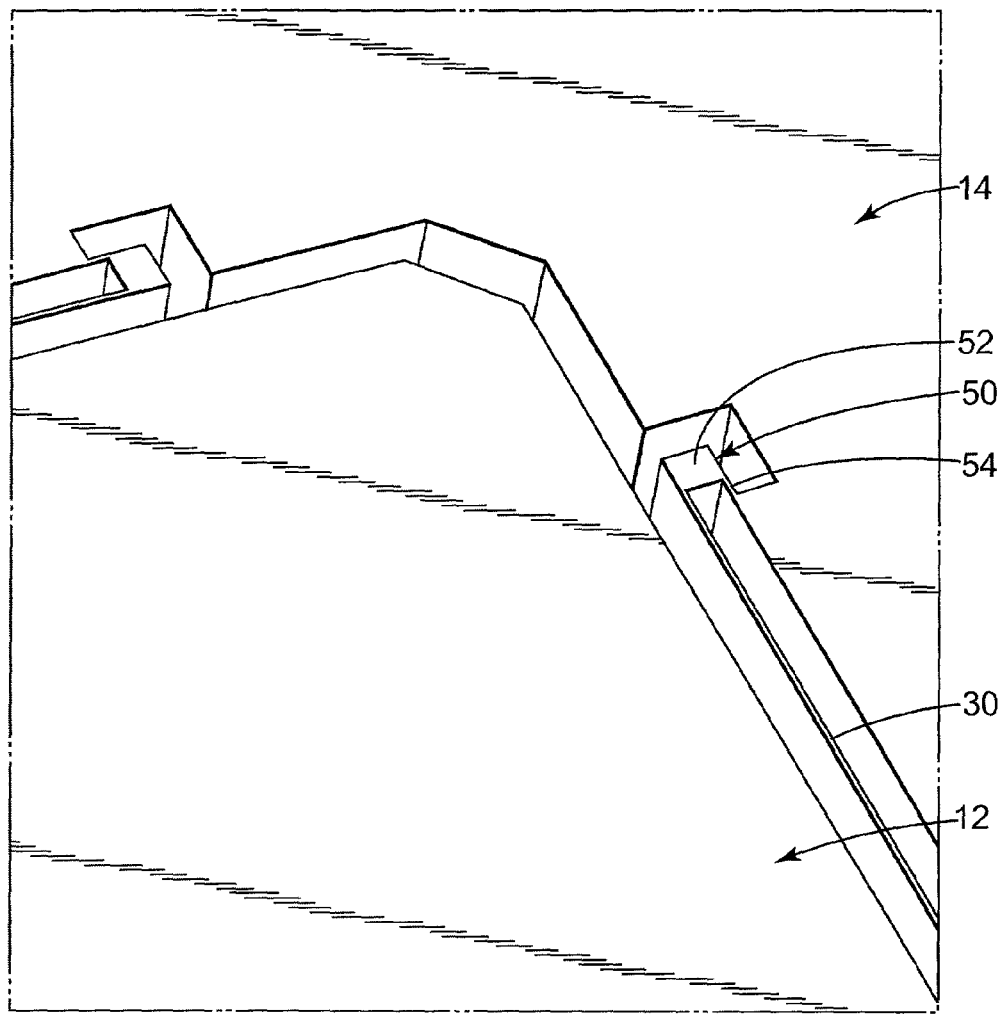
FIG. 5 is a greatly enlarged perspective view of the area 5 of FIG. 4.

In FIGS. 4 and 5, a suspension system architecture is shown which allows an end of a flexure 30 (also referred to herein as a primary flexure) to move angularly and increases the system's in-plane compliance. The device of FIGS. 4 and 5 is similar to that of FIGS. 1 and 2, with like parts sharing the same reference numbers. As can be seen, the external flexures 30 are provided with an angle softening element 50 at one end of the flexure. In the embodiment of the invention shown in FIGS. 4 and 5, angle softening elements 50 include a rigid (non-flexing) coupling block 52 secured to one end of flexure 30, and a secondary flexure 54 extending from coupling block 52 to frame 14. As primary flexure 30 is displaced by movement of rotor 12, the end of flexure 30 attached to coupling block 52 is allowed to move angularly (as opposed to being fixed to frame 14 as in FIGS. 1 and 2). As discussed above, the angular movement of the end of flexure 30 increases its in-plane compliance. At the same time, because secondary flexure 54 is essentially a short length, high-aspect beam, it has relatively low out-of-plane and torsional compliance. Thus, the influence of the poor compliance ratio characteristics of long high-aspect ratio beams is minimized. The length of secondary flexure 54 may be adjusted for particular applications to achieve the desired compliance ratios, with the realization that as the length of secondary flexure 54 increases, the out-of-plane and torsional compliance also increases. According to one embodiment of the invention, the secondary flexure 54 has a length that is approximately 5% or less than the length of the primary flexure 30 with which it interacts.

Figure 6:
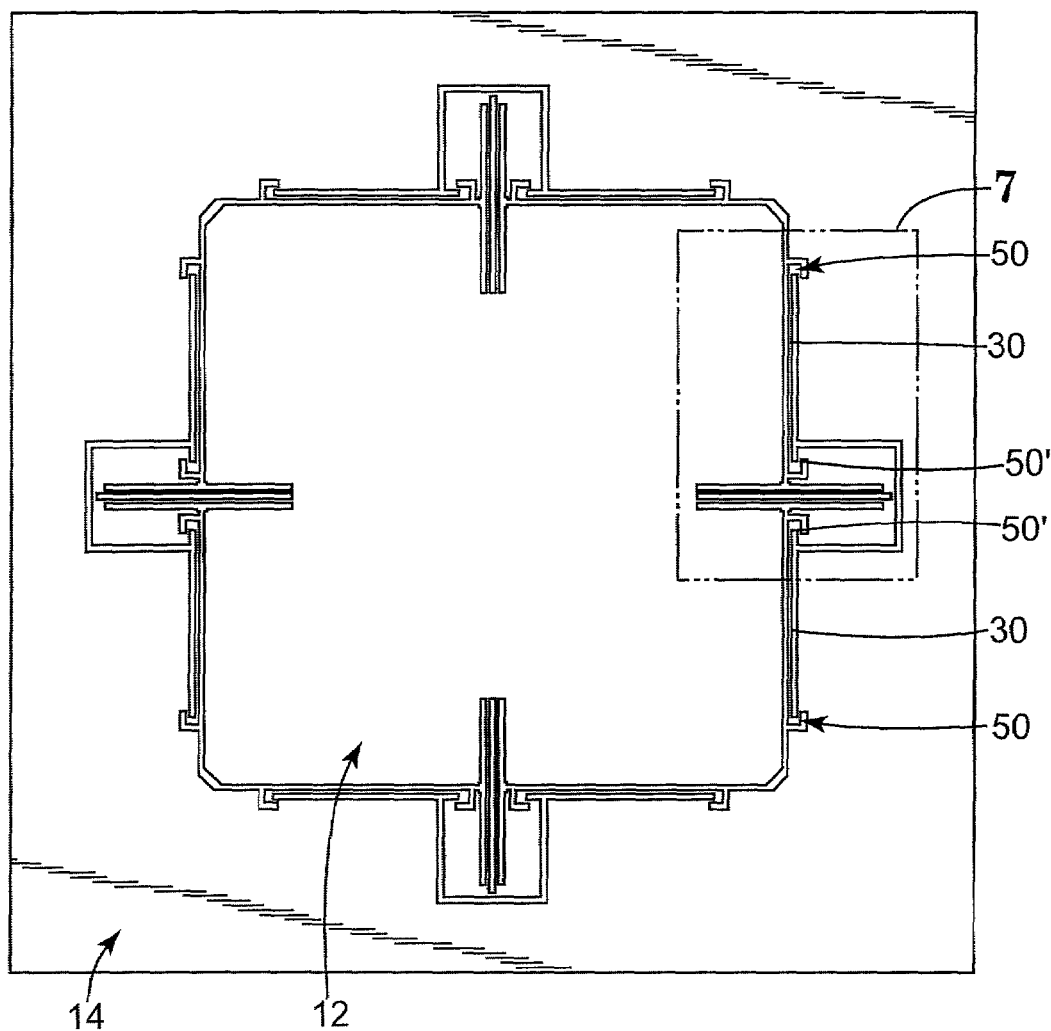
FIG. 6 is a top view of angle softening elements according to another embodiment of the invention.
Figure 7:
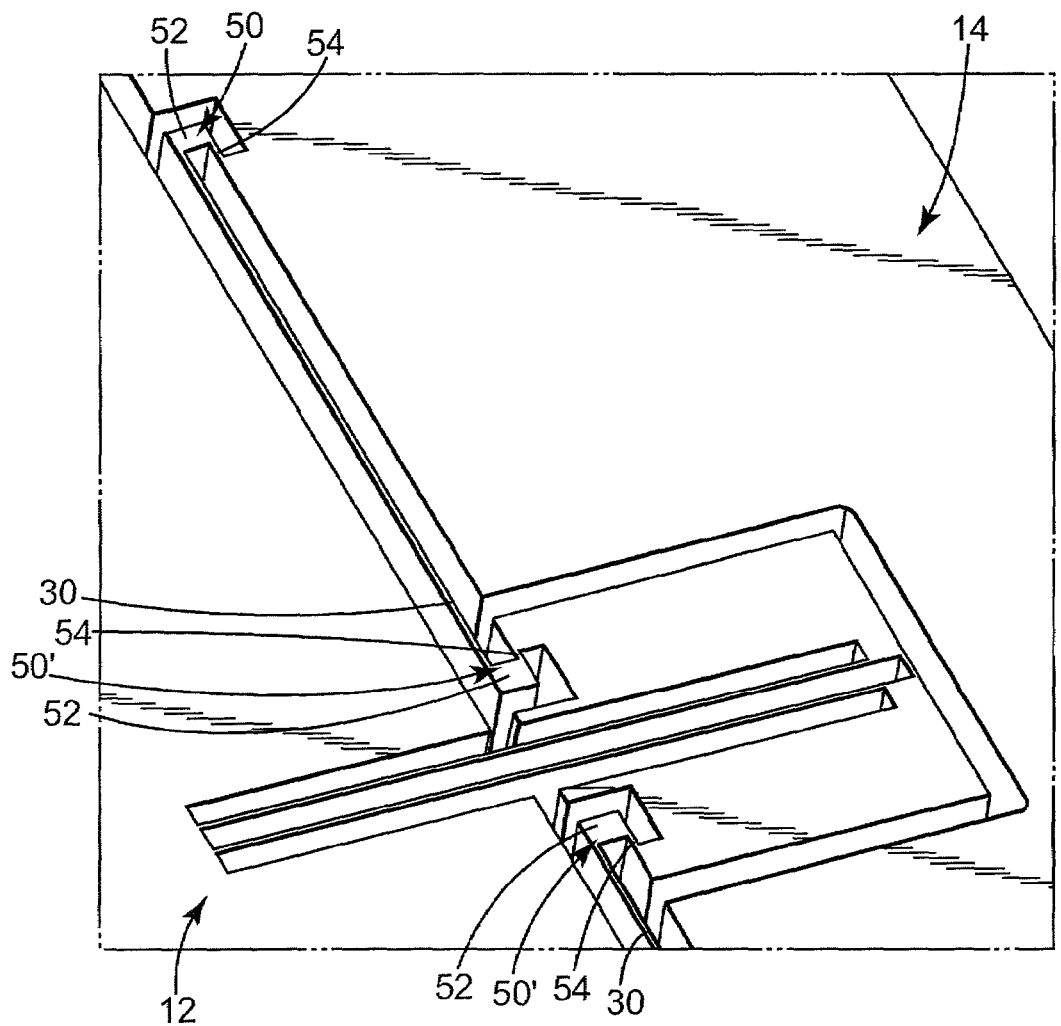
FIG. 7 is a greatly enlarged perspective view of the area 7 of FIG. 6.

More than one angle softening element 50 may be used for each primary flexure 30. FIGS. 6 and 7 show angle softening elements 50, 50' positioned at both ends of flexures 30. The construction of angle softening elements 50, 50' is like that described above in reference to FIGS. 4 and 5. The lengths of secondary flexures 54 may be different for elements 50 and 50' depending upon the desired performance characteristics. In addition, angle softening elements may be provided to internal flexures 32 if desired.

The effect of angle softening elements 50 is quantified in Tables 1 and 2 below. Using a non-linear finite element modeling package (CoventorWare™, available from Coventor of Cary, N.C.), the compliance of a system like that depicted in FIGS. 1 and 2 (Table 1) is compared to a system using angle softening elements 50 as depicted in FIGS. 4 and 5 (Table 2). As can be seen from the "% Improvement" columns in Table 2, for cases studies thus far a 20% improvement in compliance ratio was found.

The bending force required to displace and rotate an end of a flexure in the x-direction and about the z-axis, respectively, may be determined using the equation:

$$\text{Force}_x = (12EI_z/L^3)(x) - (EI_z/L^2)(\theta_z)$$

where E is Young's modulus, Iz is the area moment of inertia about the z axis, L is the length of the beam, x is the displacement of the end of the beam in the x direction, and $\theta_z$ is the assumed angle of the beam about the z-axis.

The mechanical translational stiffness kx (the inverse of compliance in the x direction), and the mechanical angular stiffness may be determined using the equations:

$$kx = 12EI_z$$

$$k\theta_z = EI_z/L^2$$

Similar equations may be derived for the forces and stiffnesses along other axes. These equations can be easily derived, by those skilled in the art, using the principle of superposition of known beam relations, or by derivation using loaded beam integration methods, which can both be found in "Engineering Mechanics of Materials" by Muvdi and McNabb. By inspection of this equation, one can see qualitatively, or by calculations for a given beam, that even a small angle at one end of the beam can greatly reduce the reaction force from the beam.

As noted above, Table 1 shows the performance of a suspension system like that illustrated in FIGS. 1 and 2, calculated using non-linear finite element modeling. Specifically, for various displacements of rotor 12 along the x-axis and z-axis, Table 1 shows the force required to displace the rotor a given distance along the axes, the resulting compliances, and then the resulting compliance ratios. The compliance ratio may be determined by comparing kz and kx. The range of data shown adequately illustrates the mechanical statics of the device over its entire range when considering the symmetry of the device.

TABLE 1

| X | Y | Z | Fx | Fy | Fz | kx | ky | kz | kz/kx | kz/ky |
|---|---|---|---|---|---|---|---|---|---|---|
| 0 | 0 | 0.1 | 0 | 0 | 761 | na | na | 7610 | na | na |
| 5 | 5 | 0.1 | 140 | 153 | 753 | 28 | 31 | 7530 | 269 | 246 |
| 10 | 10 | 0.1 | 282 | 308 | 731 | 28 | 31 | 7310 | 259 | 237 |
| 15 | 15 | 0.1 | 428 | 466 | 697 | 29 | 31 | 6970 | 244 | 224 |
| 20 | 20 | 0.1 | 580 | 629 | 654 | 29 | 31 | 6540 | 226 | 208 |
| 25 | 25 | 0.1 | 739 | 798 | 606 | 30 | 32 | 6060 | 205 | 190 |
| 0 | 0 | 0.1 | 0 | 0 | 761 | na | na | 7610 | na | na |
| 5 | 0 | 0.1 | 140 | 0 | 757 | 28 | na | 7570 | 270 | na |
| 10 | 0 | 0.1 | 281 | 1 | 746 | 28 | na | 7460 | 265 | na |
| 15 | 0 | 0.1 | 427 | 1 | 728 | 28 | na | 7280 | 256 | na |
| 20 | 0 | 0.1 | 578 | 2 | 704 | 29 | na | 7040 | 244 | na |
| 25 | 0 | 0.1 | 739 | 3 | 677 | 30 | na | 6770 | 229 | na |

TABLE 2

| | | | | | | | | | | | % Improvement | |
|---|---|---|---|---|---|---|---|---|---|---|---|---|
| X | Y | Z | Fx | Fy | Fz | kx | ky | kz | kz/kx | kz/ky | kz/kx | kz/ky |
| 0 | 0 | 0.1 | 0 | 0 | 589 | na | na | 5890 | na | na | na | na |
| 5 | 5 | 0.1 | 90 | 88 | 584 | 18 | 18 | 5840 | 326 | 330 | 21% | 34% |
| 10 | 10 | 0.1 | 181 | 179 | 571 | 18 | 18 | 5710 | 315 | 319 | 22% | 34% |
| 15 | 15 | 0.1 | 277 | 272 | 550 | 18 | 18 | 5500 | 298 | 303 | 22% | 35% |
| 20 | 20 | 0.1 | 379 | 370 | 524 | 19 | 19 | 5240 | 277 | 283 | 23% | 36% |
| 25 | 25 | 0.1 | 489 | 475 | 494 | 20 | 19 | 4940 | 253 | 260 | 23% | 37% |
| 0 | 0 | 0.1 | 0 | 0 | 589 | na | na | 5890 | na | na | na | na |
| 5 | 0 | 0.1 | 90 | 0 | 586 | 18 | na | 5860 | 327 | na | 21% | na |
| 10 | 0 | 0.1 | 181 | 0 | 579 | 18 | na | 5790 | 320 | na | 20% | na |

TABLE 2-continued

| X | Y | Z | Fx | Fy | Fz | kx | ky | kz | kz/kx | kz/ky | % Improvement kz/kx | kz/ky |
|---|---|---|---|---|---|---|---|---|---|---|---|---|
| 15 | 0 | 0.1 | 277 | 0 | 568 | 18 | na | 5680 | 308 | na | 20% | na |
| 20 | 0 | 0.1 | 379 | 0 | 554 | 19 | na | 5540 | 292 | na | 20% | na |
| 25 | 0 | 0.1 | 489 | 0 | 537 | 20 | na | 5370 | 275 | na | 20% | na |

In Table 2, the performance of a suspension system like that illustrated in FIGS. 4 and 5 is illustrated. The non-linear finite element modeling shows that the inclusion of angle softening elements 50 raised the compliance ratio at least 20% in all cases. More improvement may be achieved through parameter optimization. Although the force needed to displace rotor 12 a given distance along the z-axis (out of plane) is less with the second design, it is more than offset by the greater reduction in the force needed to displace rotor 12 along the x and y axes (in plane).

Figure 8:
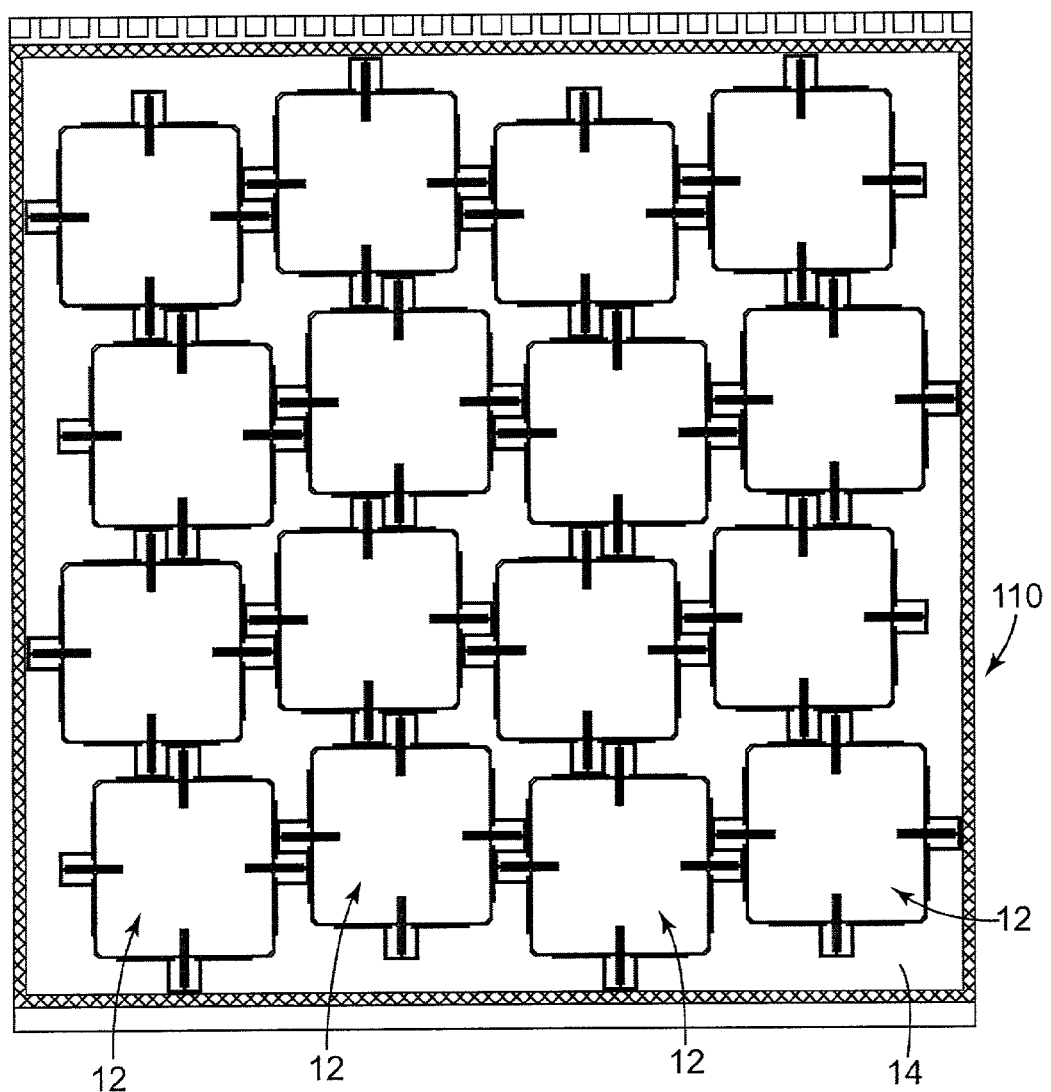
FIG. 8 is a top view of multiple rotors suspended within a frame.

Although the storage module 10 has been described above with respect to a single rotor 12 supported by frame 14, in practice a plurality of rotors 12 may be supported by frame 14. A storage module 110 having an array of rotors 12 is illustrated in FIG. 8, although finer features such as angle softening elements 50 and 50' may not be seen.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A data storage module for a data storage device, the storage module comprising:
    a rotor having a plurality of data storage areas, the storage areas each being in one of a plurality of states to represent the data stored in that area;
    a frame;
    a plurality of primary flexures;
    a plurality of rigid coupling blocks, each of the plurality of coupling blocks connected to a first end of an associated one of the primary flexures; and
    a plurality of secondary flexures, each of the plurality of secondary flexures connected to an associated one of the coupling blocks, the associated primary flexures, coupling blocks and secondary flexures extending between the rotor and the frame to suspend the rotor within the frame, wherein the secondary flexures have lengths less than lengths of the associated primary flexures.

2. The data storage module of claim 1, wherein the secondary flexures each have a longitudinal orientation generally aligned with a longitudinal orientation of the associated one of the primary flexures.

3. The data storage module of claim 1, wherein a second end of at least one of the primary flexures is connected to a second associated coupling block and secondary flexure.

4. The data storage module of claim 1, wherein the primary and secondary flexures are micro-fabricated beams.

5. The data storage module of claim 1, wherein the primary and secondary flexures are high aspect ratio beams.

6. The data storage module of claim 5, wherein the primary and secondary flexures have height to width ratios of approximately 10 or greater.

7. A data storage module for a data storage device, the storage module comprising:
    a rotor having a plurality of data storage areas, the storage areas each being in one of a plurality of states to represent the data stored in that area;
    a frame;
    a primary flexure;
    a secondary flexure connected to the primary flexure, wherein the primary flexure and secondary flexure extend between the rotor and the frame to suspend the rotor within the frame, and wherein the secondary flexure has a length that is 5% or less of a length of the primary flexure.

8. The data storage module of claim 7, wherein the secondary flexure has a longitudinal orientation generally aligned with a longitudinal orientation of the primary flexure.

9. The data storage module of claim 7, wherein the secondary flexure is connected to the primary flexure by a rigid coupling block, and wherein the primary flexure, coupling block and secondary flexure extend between the rotor and the frame to suspend the rotor within the frame.

10. A data storage module for a data storage device, the storage module comprising:
    a rotor having a plurality of data storage areas, the storage areas each being in one of a plurality of states to represent the data stored in that area;
    a frame;
    a primary flexure having a first end and a second end, the first end of the primary flexure connected to a first coupling block having an associated secondary flexure, and the second end of the primary flexure connected to a second coupling block having an associated secondary flexure;
    wherein the primary flexure, first and second coupling blocks and associated secondary flexures extend between the rotor and the frame to suspend the rotor within the frame.

11. The data storage module of claim 10, wherein at least one of the secondary flexures has a length that is 5% or less of a length of the primary flexure.

12. The data storage module of claim 10, wherein at least one of the secondary flexures has a longitudinal orientation generally aligned with a longitudinal orientation of the primary flexure.

13. The data storage module of claim 10, wherein at least one of the first and second coupling blocks is rigid.

* * * * *